United States Patent
Oka

(10) Patent No.: US 8,797,070 B2
(45) Date of Patent: Aug. 5, 2014

(54) POWER-ON RESET CIRCUIT

(71) Applicant: Seiko Instruments Inc., Chiba (JP)

(72) Inventor: Tomohiro Oka, Chiba (JP)

(73) Assignee: Seiko Instruments Inc., Chiba (JP)

( * ) Notice: Subject to any disclaimer, the term of this patent is extended or adjusted under 35 U.S.C. 154(b) by 57 days.

(21) Appl. No.: 13/750,456

(22) Filed: Jan. 25, 2013

(65) Prior Publication Data

US 2013/0194011 A1    Aug. 1, 2013

(30) Foreign Application Priority Data

Jan. 30, 2012  (JP) ................................. 2012-017053
Sep. 25, 2012  (JP) ................................. 2012-211308

(51) Int. Cl.
*H03L 7/00* (2006.01)
*H03K 17/22* (2006.01)

(52) U.S. Cl.
CPC .................................... *H03K 17/223* (2013.01)
USPC .......................................... 327/142; 327/143

(58) Field of Classification Search
None
See application file for complete search history.

(56) References Cited

U.S. PATENT DOCUMENTS

| | | | |
|---|---|---|---|
| 6,335,646 B1 * | 1/2002 | Nagatomo | 327/143 |
| 6,377,090 B1 * | 4/2002 | Bruno | 327/143 |
| 6,759,852 B1 * | 7/2004 | Samad | 324/522 |
| 7,230,456 B2 * | 6/2007 | Dayley | 327/50 |
| 7,863,951 B2 * | 1/2011 | Thorp et al. | 327/143 |
| 2005/0001660 A1 * | 1/2005 | Roy | 327/143 |
| 2006/0033540 A1 * | 2/2006 | Lee et al. | 327/143 |
| 2006/0145739 A1 * | 7/2006 | Kim | 327/143 |
| 2007/0024332 A1 * | 2/2007 | McLeod | 327/143 |
| 2007/0216453 A1 * | 9/2007 | Vispute et al. | 327/143 |
| 2009/0160506 A1 | 6/2009 | Watanabe | |
| 2011/0074470 A1 * | 3/2011 | Sanborn et al. | 327/143 |
| 2011/0084740 A1 * | 4/2011 | Kawamura | 327/143 |
| 2012/0092047 A1 * | 4/2012 | Chen et al. | 327/143 |

FOREIGN PATENT DOCUMENTS

JP        2009-152735 A    7/2009

* cited by examiner

*Primary Examiner* — Tuan T Lam
(74) *Attorney, Agent, or Firm* — Brinks Gilson & Lione

(57) ABSTRACT

The power-on reset circuit includes: a NMOS transistor having a source connected to a second power supply terminal and a gate connected to a drain thereof; a depletion-type NMOS transistor having a source connected to the drain of the NMOS transistor, a drain connected to a first power supply terminal and a gate connected to the second power supply terminal; a PMOS transistor having a source connected to the first power supply terminal, a gate connected to the drain of the NMOS transistor and a drain; a capacitor having one end connected to the drain of the PMOS transistor and the other end connected to the second power supply terminal; and a waveform shaping circuit having an input terminal connected to the drain of the PMOS transistor and an output terminal from which a power-on reset signal is output.

1 Claim, 1 Drawing Sheet

US 8,797,070 B2

POWER-ON RESET CIRCUIT

RELATED APPLICATIONS

This application claims priority under 35 U.S.C. §119 to Japanese Patent Application Nos. 2012-017053 filed on Jan. 30, 2012 and 2012-211308 filed on Sep. 25, 2012, the entire contents of which are hereby incorporated by reference.

BACKGROUND OF THE INVENTION

1. Field of the Invention

The present invention relates to a power-on reset circuit for CMOS semiconductor integrated circuit.

2. Description of the Related Art

A CMOS semiconductor integrated circuit without a reset terminal includes a power-on reset circuit built therein so as to initialize an internal logic circuit or analogue circuit when the CMOS semiconductor integrated circuit is connected to a power supply.

Referring to FIG. 2, the following describes a conventional power-on reset circuit.

As a power supply voltage rises, coupling with a capacitor 111 brings the voltage of a node B close to the power supply voltage. Then, an inverter 121 turns the voltage of a node C low. The voltage of the node C is subjected to waveform shaping by a waveform shaping circuit 107, and a reset signal at a low level is output to a node D. This reset signal initializes a circuit connected to the node D. When the voltage of the node C becomes low, a NMOS transistor 103 turns OFF.

A control circuit 100 is configured to output a signal at a high level through an output terminal when an input terminal thereof is at a low level. Since a gate voltage of a NMOS transistor 102 becomes high, the NMOS transistor 102 turns ON, and electrical charge stored in the capacitor 111 is discharged through a depletion-type NMOS transistor 101. When the voltage of the node B decreases to an inversion voltage of the inverter 121, then the voltage of the node C becomes high. The voltage of the node C is subjected to waveform shaping by the waveform shaping circuit 107, and the reset signal of the node D is canceled. The voltage of the node C at a high level further turns the NMOS transistor 103 ON and causes the capacitor 111 to discharge, so that the voltage of the node B becomes the ground voltage.

Herein, the conventional power-on reset circuit is provided with a pull-down element 122 at the node C, and so has a feature that the voltage of the node C becomes less unstable even when the rising speed of the power supply voltage is slow or the power supply voltage rises from a voltage other than the ground voltage.
[Patent Document 1] Japanese Patent Application Laid-Open No. 2009-152735

SUMMARY OF THE INVENTION

The conventional power-on reset circuit, however, may not operate normally when the internal voltage becomes unstable. Especially in the case where the power supply voltage rises from a negative state, even when the voltage of the node B does not fall below the ground voltage, the voltage of the node C will fall below the ground voltage. As a result, even when the power supply of the waveform shaping circuit is activated later, the waveform shaping circuit cannot output a power-on reset signal.

In order to cope with the above problem, it is an object of the present invention to provide a power-on reset circuit capable of ensuring the output of a power-on reset signal irrespective of the activation state of a power supply.

A power-on reset circuit of the present invention includes: a NMOS transistor having a source connected to a second power supply terminal and a gate connected to a drain thereof; a depletion-type NMOS transistor having a source connected to the drain of the NMOS transistor, a drain connected to a first power supply terminal and a gate connected to the second power supply terminal; a PMOS transistor having a source connected to the first power supply terminal, a gate connected to the drain of the NMOS transistor and a drain; a capacitor having one end connected to the drain of the PMOS transistor and the other end connected to the second power supply terminal; and a waveform shaping circuit having an input terminal connected to the drain of the PMOS transistor and an output terminal from which a power-on reset signal is output. When there is not a sufficient potential difference between the first and second power supply terminals, the PMOS transistor is in a cut-off state. Whereas when there is a sufficient potential difference between the power supply terminals, the PMOS transistor turns ON so as to charge the capacitor and thereafter a power-on reset signal is output from the waveform shaping circuit.

The present invention can ensure the output of a power-on reset signal at rising from any power supply voltage.

DETAILED DESCRIPTION OF THE PREFERRED EMBODIMENTS

Figure 1:
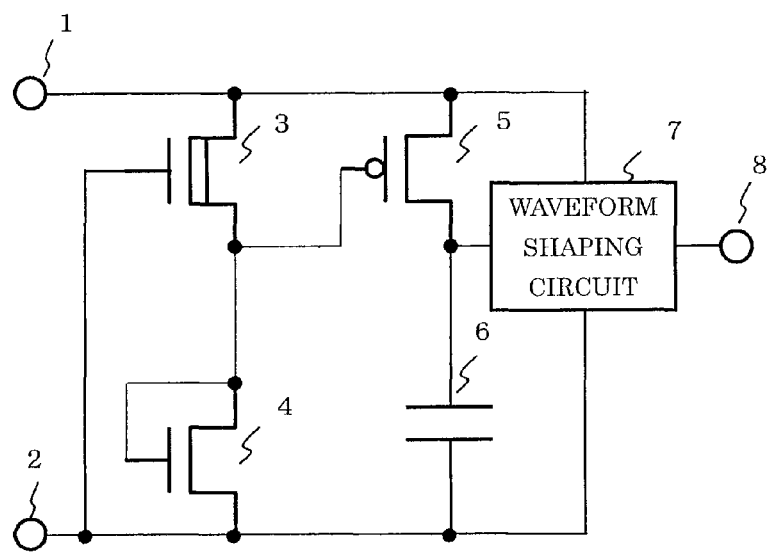
FIG. 1 is a circuit diagram illustrating a power-on reset circuit of the present invention.
Figure 2:
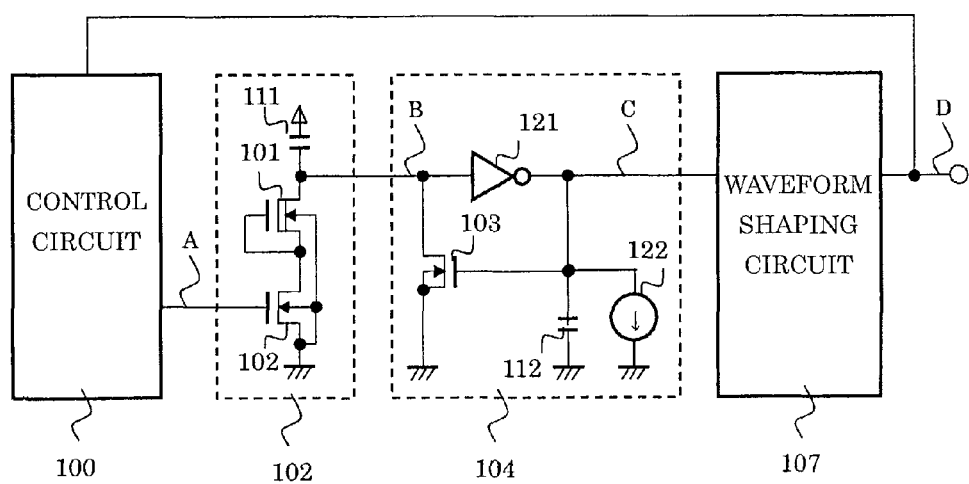
FIG. 2 is a circuit diagram illustrating the conventional power-on reset circuit.

FIG. 1 is a circuit diagram illustrating a power-on reset circuit of the present invention.

The power-on reset circuit includes a depletion-type NMOS transistor 3, a NMOS transistor 4, a PMOS transistor 5, a capacitor 6 and a waveform shaping circuit 7 as well as a first power supply terminal 1 and a second power supply terminal 2.

The NMOS transistor 4 has a source connected to the second power supply terminal 2 and a gate connected to a drain thereof. The depletion-type NMOS transistor 3 has a drain connected to the first power supply terminal 1, a source connected to the drain of the NMOS transistor 4 and a gate connected to the second power supply terminal 2. The PMOS transistor 5 has a source connected to the first power supply terminal 1, a gate connected to the drain of the NMOS transistor 4 and a drain connected to one of terminals of the capacitor 6. The other terminal of the capacitor 6 is connected to the second power supply terminal 2. The waveform shaping circuit 7 has an input terminal connected to the drain of the PMOS transistor 5, and outputs a power-on reset signal 8.

The thus configured power-on reset circuit of the present invention operates as follows so as to ensure the output of a power-on reset signal.

When a potential difference between the first power supply terminal 1 and the second power supply terminal 2 is smaller than an absolute value of a threshold voltage of the depletion-type NMOS transistor 3, the depletion-type NMOS transistor 3 is in ON-state so that the drain voltage of the NMOS transistor 4 saturation-connected thereto becomes equal to the voltage of the first power supply terminal 1.

As the power supply voltage increases, the drain voltage of the NMOS transistor 4 increases to a smaller voltage between the threshold voltage of the NMOS transistor 4 and the threshold voltage of the depletion-type NMOS transistor 3.

Since the drain voltage of the NMOS transistor 4 is input as a gate voltage of the PMOS transistor, as the power supply voltage increases, the PMOS transistor 5 transitions from a cut-off state to an ON state. Transitioning to the ON-state, the PMOS transistor 5 starts to charge to the capacitor 6, and when the capacitor is sufficiently charged, the waveform shaping circuit 7 cancels the power-on reset signal 8.

Even when the voltage of the first power supply terminal falls below the voltage of the second power supply terminal, due to the ON-state kept in the depletion-type NMOS transistor 3 as well as the OFF-state of the PMOS transistor 5 or the parasitic diode, a voltage slightly higher than that of the first power supply terminal appears at the terminal connected to the capacitor 6.

Thereafter in the course of process where the potential difference between the first power supply terminal and the second power supply terminal becomes zero and the voltage of the first power supply terminal becomes higher than that of the second power supply terminal, the drain voltage of the saturation-connected NMOS transistor 4 is equal to the voltage of the first power supply terminal in the region of the ON-state of the depletion-type NMOS transistor 3 and an operation after reaching the cut-off state is similar to a typical rising operation of a power supply.

As described above, the power-on reset circuit of the present invention can ensure that a power-on reset signal is output irrespective of the activation state of a power supply.

What is claimed is:

1. A power-on reset circuit, comprising:
   a NMOS transistor having a source connected to a second power supply terminal and a gate connected to a drain thereof;
   a depletion-type NMOS transistor having a source connected to the drain of the NMOS transistor, a drain connected to a first power supply terminal and a gate connected to the second power supply terminal;
   a PMOS transistor having a source connected to the first power supply terminal, a gate connected to the drain of the NMOS transistor and a drain;
   a capacitor having one end connected to the drain of the PMOS transistor and the other end connected to the second power supply terminal; and
   a waveform shaping circuit having an input terminal connected to the drain of the PMOS transistor and an output terminal from which a power-on reset signal is output.

* * * * *